United States Patent
Pagani (10) Patent No.: US 10,288,682 B2
(45) Date of Patent: *May 14, 2019

(54) INTEGRATED ELECTRONIC DEVICE HAVING A TEST ARCHITECTURE, AND TEST METHOD THEREOF

(71) Applicant: STMICROELECTRONICS S.R.L., Agrate Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/813,000

(22) Filed: Nov. 14, 2017

(65) Prior Publication Data

US 2018/0067163 A1    Mar. 8, 2018

Related U.S. Application Data

(63) Continuation of application No. 14/958,093, filed on Dec. 3, 2015, now Pat. No. 9,823,304.

(30) Foreign Application Priority Data

Apr. 30, 2015  (IT) .............................. TO2015A0236

(51) Int. Cl.
*G01R 31/317* (2006.01)
*G01R 31/3177* (2006.01)
*G01R 31/3185* (2006.01)

(52) U.S. Cl.
CPC ... *G01R 31/3177* (2013.01); *G01R 31/31713* (2013.01); *G01R 31/318536* (2013.01); *G01R 31/318563* (2013.01)

(58) Field of Classification Search
CPC .............................................. G01R 31/318555
USPC ......................................................... 714/727
See application file for complete search history.

(56) References Cited

U.S. PATENT DOCUMENTS

| 5,867,507 A | 2/1999 | Beebe et al. |
| 2006/0107160 A1 | 5/2006 | Ricchetti et al. |
| 2007/0011542 A1 | 1/2007 | Mukherjee et al. |

(Continued)

OTHER PUBLICATIONS

Italian Search Report, dated Apr. 30, 2015, for corresponding Italian Application No. TO20150236, 2 pages.

(Continued)

*Primary Examiner* — Fritz Alphonse
(74) *Attorney, Agent, or Firm* — Seed IP Law Group LLP (57) ABSTRACT

An electronic device having a functional portion and a test portion. The test portion includes a boundary scan register formed by a plurality of test cells arranged in the body according to a register sequence, where first test cells are configured to form a serial-to-parallel converter and second test cells are configured to form a parallel-to-serial converter. The test cells are each coupled to a respective data access pin of the device and to a respective input/output point of the functional part and have a first test input and a test output. The boundary scan register defines two test half-paths formed, respectively, by the first test cells and by the second test cells. The first test cells are directly coupled according to a first sub-sequence, and the second test cells are directly coupled according to a second sub-sequence.

23 Claims, 10 Drawing Sheets

(56) References Cited

U.S. PATENT DOCUMENTS

2007/0022345 A1* 1/2007 Smith ............ G01R 31/318385
    714/734
2007/0061644 A1   3/2007 Birmiwal et al.
2011/0099442 A1   4/2011 Hales et al.
2013/0285739 A1* 10/2013 Blaquiere ...... G01R 31/318555
    327/565
2015/0049004 A1   2/2015 Deering et al.

OTHER PUBLICATIONS

Vermeulen et al., "IEEE 1149.1—compliant Access Architecture for Multiple Core Debug on Digital System Chips," *Proceedings of the International Test Conference*, pp. 55-63, 2002. (11 pages).

IEEE-SA Standards Board, "IEEE Standard Test Access Port and Boundary-Scan Architecture," IEEE Std 1149.1TM-2001 (R2008), Revision of IEEE Std 1149.1-1990) Test Technology Standards Committee, IEEE Computer Society, The Institute of Electrical and Electronics Engineers, Inc. New York, NY, Jul. 23, 2001, 208 pages.

* cited by examiner

INTEGRATED ELECTRONIC DEVICE HAVING A TEST ARCHITECTURE, AND TEST METHOD THEREOF

BACKGROUND

Technical Field

The present invention relates to an integrated electronic device having a test architecture and to the test method thereof.

Description of the Related Art

As is known, as the complexity of integrated electronic devices increases and the number of data access pins increases, the desirability of tools enabling fast testing thereof, without having to contact all the pins one by one, increases. This has led, in the mid eighties, to devising a standard, initially called JETAG (Joint European Test Action Group) and subsequently called JTAG (Joint Test Action Group), which developed in 1990 into the IEEE 1149.1 standard, also referred to as TAP (Test Access Port) or also as BSA (Boundary Scan Architecture).

The above standard envisages addition of a test logic stage that is integrated in the electronic circuit (which is, in general, a digital circuit or a mixed digital-analog circuit) in order to:

- test the interconnections between integrated circuits once they are assembled on a printed-circuit board or on some other substrate;
- test the interconnections of the integrated circuit; and
- monitor or modify the activities of the integrated circuit during its normal operation.

Figure 1:
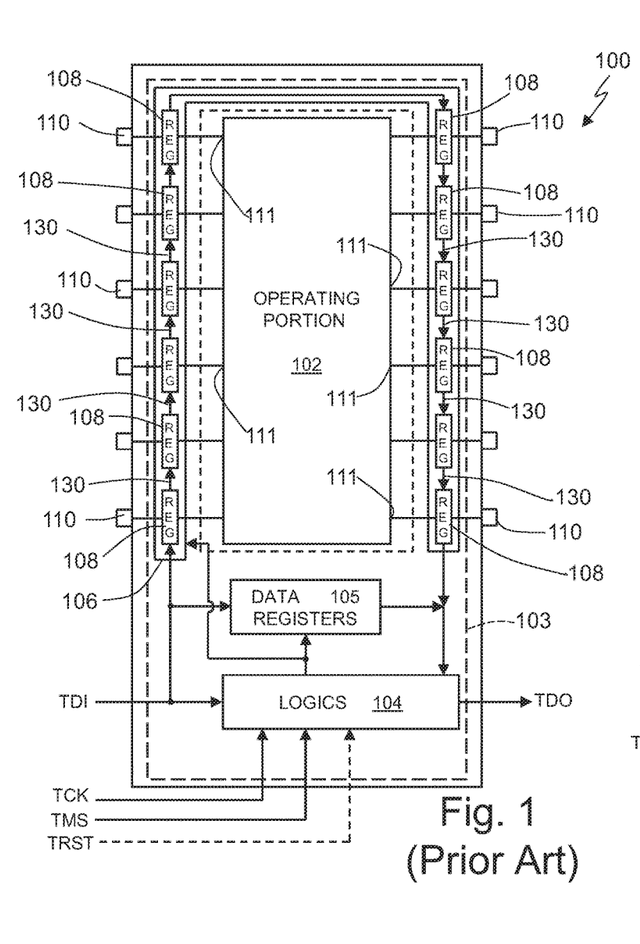
FIG. 1 is a diagram of an integrated electronic device having a logic-test architecture according to a standard.

According to this approach, the test logic stage (also referred to as Test Access Port—TAP) comprises a plurality of test cells or test registers, one for each pin of the device, which are connected to each other in cascade, a logic stage, and one or more further data registers, as shown in FIG. 1. Here, an integrated device 100, of a generic digital type, comprises an operating portion 102 and the test access port (TAP) 103 and has data access pins 110, which include both data input pins and data output pins. In turn, the test access port (TAP) 103 comprises a test logic circuitry 104 (see also FIG. 2), a boundary scan register 106 and a plurality of data registers 105 (see also FIG. 2), whereof only one is shown in FIG. 1. The boundary scan register 106 is generally arranged, in the layout of the integrated devices 100, in a boundary position with respect to the semiconductor chip so as to surround the operating portion 102 and simplify connection between the test cells 108 and the data access pins 110 of the integrated devices 100. The boundary scan register 106 is formed by the plurality of test cells 108, arranged according to a physical sequence determined by the position of the data access pins 110 around the operating portion and connected to each other in cascade according to the physical sequence via connection lines 130, formed using known integration techniques.

Figure 2:
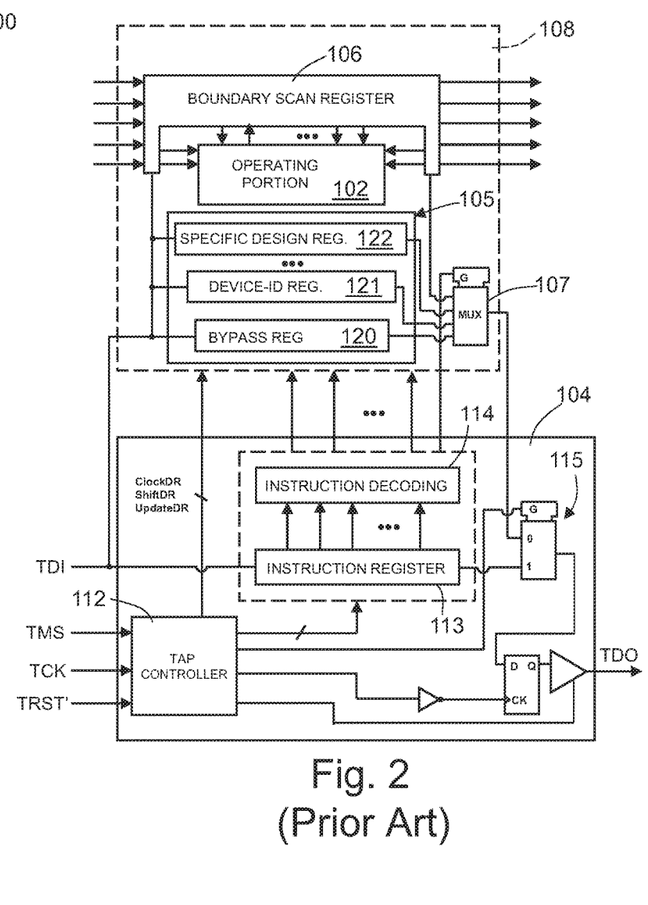
FIG. 2 is a more detailed diagram of a part of the device of FIG. 1.

FIG. 2 shows a simplified diagram of the test logic circuitry 104 including a controller 112, an instruction register 113, an instruction-decoding register 114, and logic gates 115. The data registers 105 comprise, for example, a bypass register 120, a device-identification register 121, and one or more specific design registers 122, according to the choices of the designer of the integrated device 100. The sequential output bits of the data registers 105 and of the boundary scan register 106 are multiplexed through an output multiplexer 107, as well as through the logic gates 115, and are then outputted. It is to be noted that the set formed by the data registers 105, the boundary scan register 106, and the output multiplexer 107 constitutes a register set 108 including data registers connected in parallel between a common serial input TDI (Test-Data Input) and a common serial output TDO (Test-Data Output). The instruction register 113 each time selects the data register (from the data registers 106, 120-122) that forms the activated serial path.

The access stage 103 is connected to the outside world and exchanges with it the following signals, supplied on purposely provided pins of the same name:

TCK—Test Clock: clock signal used by the test logic circuitry 104 and distinct from the system clock of the operating portion 102;

TMS—Test-Mode Select: signal that drives switching between the test mode and the operating mode;

TDI—Test-Data Input: test input data including both test instructions (for the test logic circuitry 104) and test data (for the register set 108), supplied on the corresponding test-data input pin TDI in serial mode;

TDO—Test-Data Output: test output data including the results of the tests supplied by the boundary scan register 106 and the data stored in the data registers 105, as well as the data of the instruction register 113 toward the corresponding test-data output pin TDO in serial mode;

TRST—Test Reset: optional, enables asynchronous reset of the TAP controller 112.

Each test cell 108 is coupled between a respective data access pin 110 and a respective input/output point 111 of the operating portion 102 of the integrated device 100 and is pre-arranged for overriding the functionality of the respective data access pin 110 in test mode. In practice, during normal operation of the integrated device 100, the test cells 108 are set so as not to affect the integrated device 100 and to enable passage of data and instructions between the operating portion 102 of the integrated device 100 and the data access pins 110. The test cells 108 are thus practically invisible. Instead, in the testing step, the test cells 108 are set so that an input bitstream at the test-data input pin TDI are passed from one test cell 108 to the next in the physical sequence, until all the test cells 108 have been loaded (loading of a test word). Then, the contents of the test cells 108 are supplied to the operating portion 102 of the integrated device 100 through the input/output points 111. Next, a result word obtained by processing the previous test word is loaded by the operating portion 102 of the integrated device 100 from the input/output points 111 into the output test cells 108. The bitstream of the result word is transferred sequentially from each test cell 108 to the next one on the entire sequence and sequentially from the last test cell 108, through the test logic circuitry 104, to the exterior, on the test-data output pin TDO.

Figure 3:
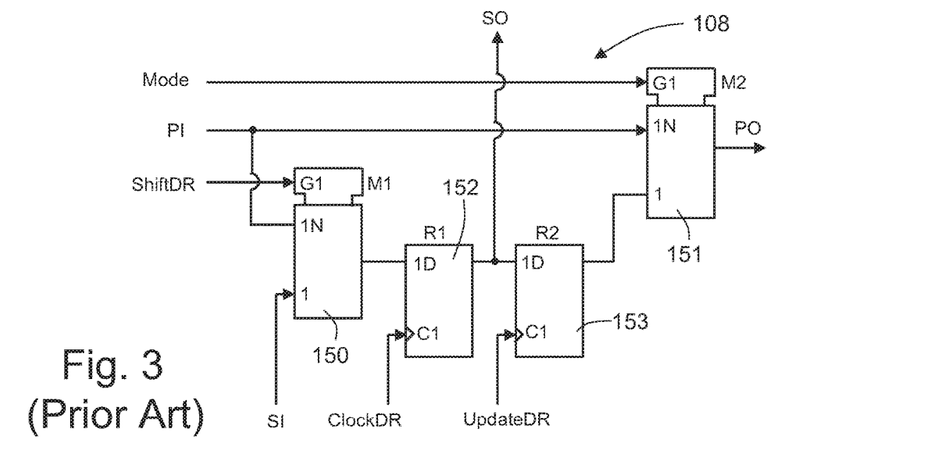
FIG. 3 is a more detailed diagram of another component of the device of FIG. 1.

FIG. 3 shows an embodiment of test cells 108 according to the above standard 1149.1. The test cells 108 are the same as each other, but are connected differently according to whether they are input test cells, designed to load the test word supplied from outside on the test-data input pin TDI, or output test cells, designed to receive the result word from the operating portion 102. In detail, each test cell 108 comprises four data terminals SI, SO, PI, PO, namely a test input SI, connected to a test cell 108 that precedes it in the physical sequence or to the test-data input pin TDI; a test output SO, connected to a test cell 108 that follows it in the physical sequence or to the multiplexer 107; a data input PI, connected to a data access pin 110 or to an input/output point 111 of the operating portion 102, according to whether the test cell is an input test cell or an output test cell, respectively; a data output PO, connected to an input/output point 111 of the operating portion 102 or to a data access pin 110, according to whether the test cell is an input test cell or an output test cell, respectively.

Furthermore, the test cell 108 has control inputs receiving control signals supplied by the test logic circuitry 104 including a mode signal Mode, which determines operation of the cell in test mode or in "transparent" mode with direct passage of the bits from the data input PI to the data output PO; a test-mode selection signal ShiftDR, which enables selective loading of the bit on the test input SI or the bit on the data input PI; a first clock signal ClockDR; and a second clock signal UpdateDR. The test cell 108 is substantially made up of two multiplexers 150, 151 with two inputs and two flip-flops 152, 153. In detail, a first multiplexer 150 receives the data SI and PI, is controlled by the test-mode selection signal ShiftDR, and has an output connected to the data input of the first flip-flop 152. The first flip-flop 152 receives the first clock signal ClockDR and has an output connected to the data input of the second flip-flop 153. The second flip-flop 153 receives the second clock signal UpdateDR and has an output connected to a first input of the second multiplexer 151. The second multiplexer 151 further receives the datum PI, is controlled by the mode signal Mode, and has an output connected to the data output PO.

In practice, the data input SI and the data output PO allow forming a sequence or chain of test cells, which may be loaded serially so that, at each pulse of clock TCK, the bits fed sequentially on the test-data input pin TDI are transferred from one test cell 108 to the next test cell 108 in the sequence, until all the test cells 108 are loaded. Then, the bits at the data outputs PO of the test cells 108 operating as input test cells are supplied in parallel to the operating portion 102. The system thus operates as a serial-to-parallel converter. At the end of the test by the operating portion 102, the test result (result word) is parallel supplied on the data inputs PI of the test cells 108 operating as output test cells. Then, the individual bits of all the test cells 108 are transferred sequentially (through the data outputs SO) towards the test-data output pin TDO; the system thus operates as a parallel-to-serial converter.

With the described architecture, unidirectional test cells 108 exist that always work either as input cells, co-operating with the other input test cells to transform the test words from the serial format, as supplied on the test-data input pin TDI, to the parallel format, as supplied to the operating portion 102 of the integrated device 100, or as output cells, co-operating with the other output test cells to transform the result word from the parallel format to the serial format as supplied to the test-data output pin TDO.

Figure 4:
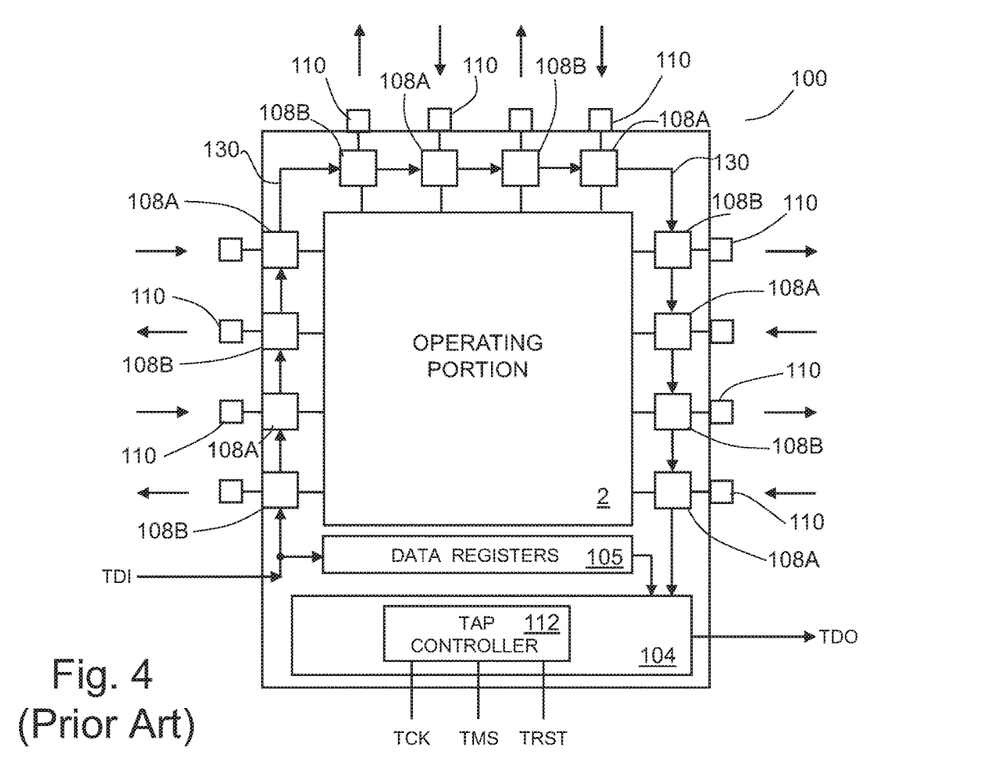
FIG. 4 shows the data flows in the device of FIG. 1.

The sequence of the test cells 108 is not, however, determined by the implemented data transit direction but on the basis of other design criteria, typically taking into account the physical vicinity to the respective input/output point 111 of the operating portion 102 of the integrated device 100. See, for example, FIG. 4, which shows a particular case of input operating test cells (input test cells 108A) and output operating test cells (output test cells 108B) that alternate with each other.

It follows that, during loading of an input test word, supplied from outside, first all the test cells 108 are loaded, irrespective of whether they are input test cells or output test cells; likewise, during unloading of the processed word.

In practice, in the presence of M input test cells 108A and N output test cells 108B, in at least M+N clock pulses TCK all the test cells 108 are loaded with the test word and in as many clock pulses the result word is outputted. Thus, in the case of complex integrated devices 100, which have a large number of test cells 108, the operations of loading of the test word and unloading of the result word are rather long and burdensome, thus increasing the test time and thus the corresponding costs.

The aforementioned 1149.1 standard also envisages the possibility of testing a plurality of integrated devices 100, for example, mounted on a same printed-circuit board 140 (FIG. 5) and interconnected via interconnection paths 141. In this case, the various integrated devices 100 are cascaded via suitably designed test paths 142 that connect the respective boundary scan registers 106 in cascade. Furthermore, the test word is serially supplied on the test-data input pin TDI of a first integrated device 100 of the chain and is transferred from one integrated device 100 to the next one in the device chain, and the processed word is sequentially unloaded from the test-data output pin TDO of the last integrated device 100 in the chain.

Figure 5:
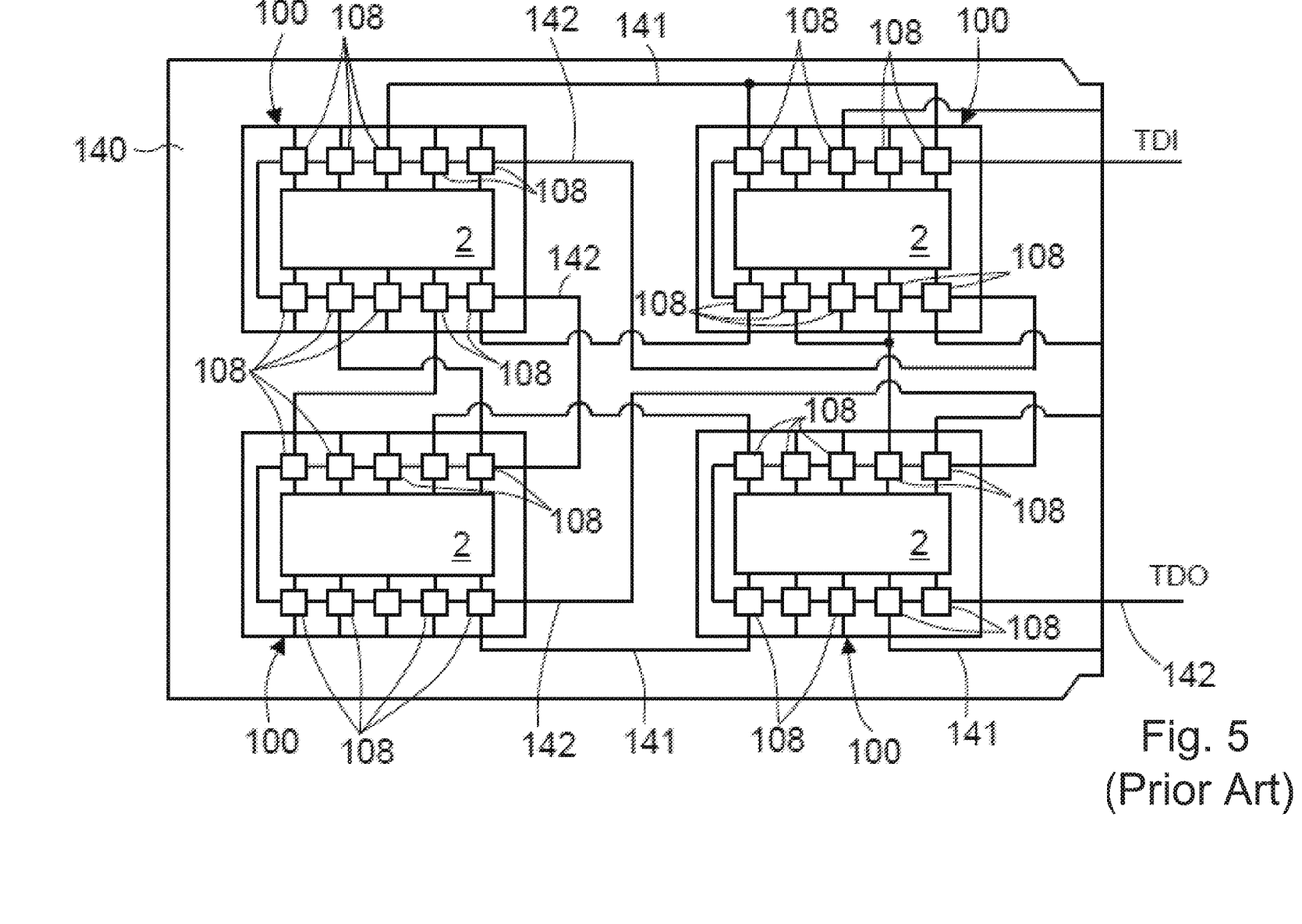
FIG. 5 shows a connection scheme of a plurality of devices according to the standard.

In practice, to enable checking of the interconnection paths 141, the test word is loaded in sequence into all the test cells 108 of the boundary scan registers 106 of all the devices 100 through the test paths 142 and loaded in parallel through the data access pins 110. Instead, to enable checking of the operating portion 102 of each integrated device 100, the boundary scan registers 106 may operate as element for isolating each operating portion 102 from the signals supplied on the interconnection paths 141 during execution of a self-test.

The 1149.1 standard also envisages a test configuration for checking the interconnection paths 141 wherein the various devices 100 have independent and separate inputs TDI and outputs TDO.

Since checking each integrated device 100 may envisage sequential loading of all the test cells of the boundary scan registers 106, the test times are long. Furthermore, for testing the printed-circuit board, in the test operations the times involved are multiplied by the number of devices 100 contained in the board, with consequent disadvantageous lengthening of the test times.

The subject matter discussed in the Background section is not necessarily prior art and should not be assumed to be prior art merely as a result of its discussion in the Background section. Along these lines, any recognition of problems in the prior art discussed in Background section or associated with such subject matter should not be treated as prior art unless expressly stated to be prior art. Instead, the discussion of any subject matter in the Background section should be treated as part of the inventor's approach to the particular problem, which in and of itself may also be inventive.

BRIEF SUMMARY

The aim of the present disclosure is to provide an architecture that overcomes the drawbacks of the prior art.

According to the present disclosure, an integrated electronic device and test method are provided, as defined in the claims.

In practice, an architecture is proposed that enables reconfiguration of the sequence of test cells in the boundary scan register 106 for aggregating or grouping a first subset of cells and a second subset of cells, in a distinct way, supplying the bits of the test word received on the test-data input pin TDI only to the first subset of test cells and connecting to the test-data output pin TDO only the second subset of test cells. In particular, the first subset may comprise only the input test cells, and the second subset may comprise only the output test cells. In this way, in the presence of M input test cells and N output test cells, a number of clock pulses is used equal to the maximum between M and N, i.e., max(M, N). In fact, in this way, both the bits of the test word supplied from outside and the bits of the processed word supplied by the operating portion have to pass through only parts of the chain (first subset and second subset of test cells), with a saving both in the time for loading of the input test cells during loading of the test word, and in the time for unloading the output test cells during shifting of the result word. Furthermore, the operation of loading of the input test cells with a new test word may occur simultaneously with unloading of the output test cells containing the bits of the result word (on the basis of the previous test word). In this way, the time for loading/unloading of the bits is equal to max(M, N).

This may be obtained, for example, (assuming M<N) by shifting N-M zero or dummy bits along the chain of input test cells. These dummy bits are then overwritten by the bits effectively belonging to the test word.

Anyway, to enable the standard test mode, reconfigurability of the sequence of test cells is provided by introducing a signal of long/short test mode that enables or not logic grouping of input/output test cells in the first or in the second subset or that preserves the long sequence set in the boundary scan register by the designer, thus enabling both a test of a fast type and a test of a traditional type.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. For a better understanding of the present invention, embodiments thereof are now described purely by way of non-limiting example, with reference to the attached drawings, wherein.

DETAILED DESCRIPTION

The described architecture provides for grouping the input test cells together and the output test cells together, in a reconfigurable way, by creating first additional connections that directly connect each input test cell to a logically subsequent input test cell, thus defining an input sequence of test cells, and second additional connections that directly connect each output test cell to a logically subsequent output test cell, thus defining an output sequence of test cells. In practice, two separate subchains are generated, which may be connected together or not and form two half-paths, one for the input test cells and one for the output test cells.

Figure 6:
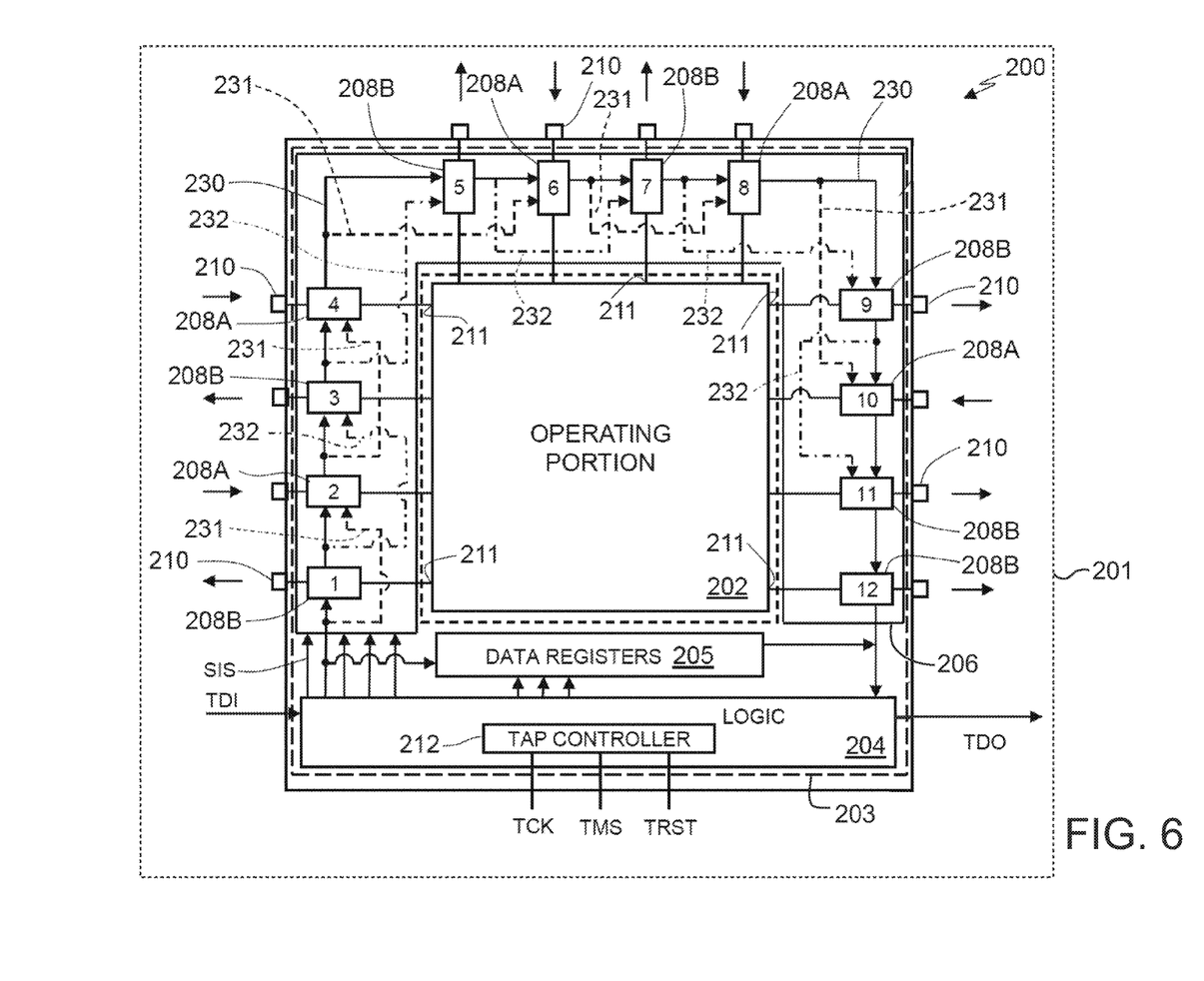
FIG. 6 shows a connection scheme of test cells with the present architecture.

FIG. 6 shows an implementation wherein an integrated device 200, forming an integrated electronic device of a digital or mixed type, has a general configuration similar to the integrated device 100 of FIG. 1. In detail, the integrated device 200 is integrated in a body 201, manufactured using semiconductor technology, has a plurality of data access pins 210, and comprises an operating portion 202 and a test access port (TAP) 203. The test access port (TAP) 203 comprises a test logic circuitry 204 (similar to the test logic circuitry 104 shown in FIG. 2; see also FIG. 11), a plurality of data registers 205, just one whereof is shown in FIG. 6, and a boundary scan register 206. The boundary scan register 206 is formed by a plurality of test cells 208. As described with reference to FIG. 1, for simplicity hereinafter the test cells 208 are also referred to as "input test cells 208A", if they have the function of loading the bits of the test word supplied serially from outside and of transferring them in parallel to the operating portion 202, and as "output cells 208B", if they have the function of parallel loading the bits of result words from the operating portion 202 and outputting them serially.

The test cells 208 are cascade connected to each other via first connection lines 230 (represented with a solid line in the figure), similar to the connection lines 130 of FIG. 1, for forming a long serial path. The first connection lines 230 thus directly connect pairs of test cells 208 that immediately follow each other in the physical sequence, in general physically adjacent to each other, to form a long path that comprises all the test cells 208. In addition, the test cells 208 are connected together via second connection lines 231 (represented with a dashed line in the figure), which connect in sequence only the test cells 208A acting as input test cells, and via third connection lines 232 (represented with a dashed and dotted line in the figure), which connect in sequence only the test cells 208B acting as output test cells. In particular, the second and third connection lines 231, 232 directly connect pairs of test cells 208 that immediately follow each other in the respective input/output sequence and thus form, in the example shown, two short half-paths (an input half-path and an output half-path) that are distinct from each other. According to one embodiment, the two short half-paths form together the long path. It is to be noted that, in the framework of the present description, the expression "directly connect" indicates that no intermediate test cells are present.

Since only the input test cells 208A form a serial-to-parallel converter S-P (as explained hereinafter), whereas only the output test cells 208B form a parallel-to-serial converter P-S, the second connection lines 231 and the third connection lines 232 enable grouping of the test cells 208 on the basis of their conversion function.

For instance, FIG. 6 shows an embodiment wherein each input test cell 208A has on its side two output test cells 208B, and vice versa, except obviously for the first test cell and the last test cell of the boundary scan register 206 (which here are two output test cells 208B). Here, to enable a clearer understanding, the test cells 208A, 208B are also numbered as 1, 2, . . . , 12 according to the long sequence in the boundary scan register 106, on the basis of the long serial path defined by the first connection lines 230.

Furthermore, apart from the first test cell numbered 1 and the last test cell numbered 12 and ignoring for the moment connection to the data access pins 210 and to the operating part 202 of the integrated device 200, each test cell 208 has two data inputs: a first data input connected to a previous test cell 208 in the long path through a first connection line 230, and a second data input connected to a logically previous test cell 208 in the respective half-path, through a second connection line 231 or a third connection line 232, according to whether it is an input test cell 208A or an output test cell 208B.

Thus, in the example shown, the test cell 208A, numbered 2 (first input test cell in the input half-path), has an input connected to the previous cell in the long sequence (output test cell 208B numbered 1) via a first connection line 230 and a second input connected to the test-data input pin TDI, via a second connection line 231. The output of the test cell 208A numbered 2 is further connected both to the next test cell in the long sequence (output test cell 208B numbered 3), via a first connection line 230, and to the next test cell in the input half-path (test cell 208A numbered 4) via a second connection line 231, and so forth.

In this way, the long sequence defining the long path comprises all the test cells numbered 1-2-3- . . . -11-12. The sequence of input cells numbered 2-4-6-8-10 (all input test cells 208A) defines the input half-path, and the sequence of input cells numbered 1-3-5-7-9-11-12 (all output test cells 208B) defines the output half-path.

Selection between the full-shift mode (by activating the long path) and the short-shift mode (by activating the input/output half-paths) is determined by the value of a serial-input selection signal SIS generated by the test logic circuitry 204, as described hereinafter with reference to FIG. 11.

Figure 8:
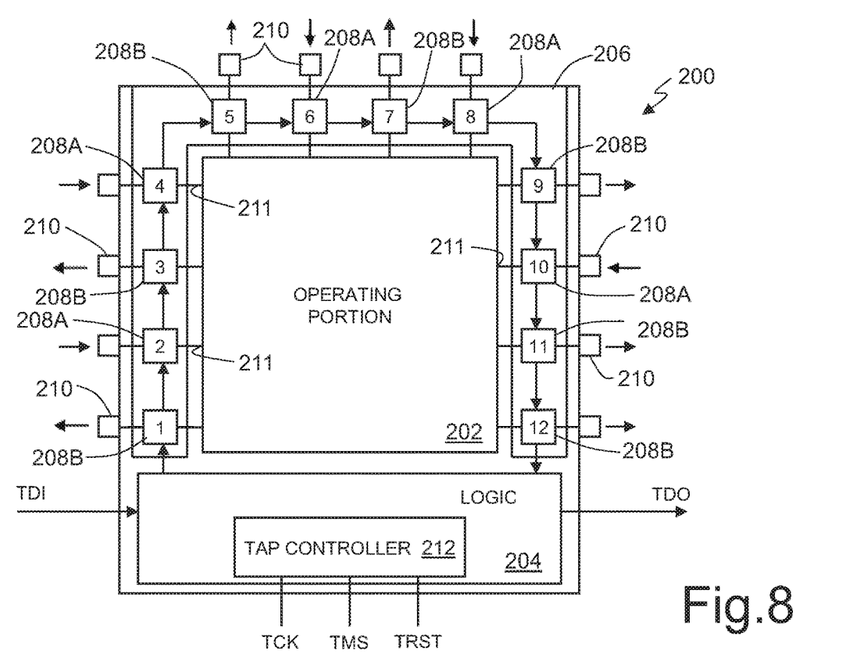

In this way, by coupling all the test cells 208 through the first connection lines 230 (long sequence) it is possible to load the test cells 208 in standard mode, as shown in the equivalent of FIG. 8, where the data bits coming from the test-data input pin TDI are shifted in sequence 1-2-3- . . . -11-12 in standard mode.

Figure 7:
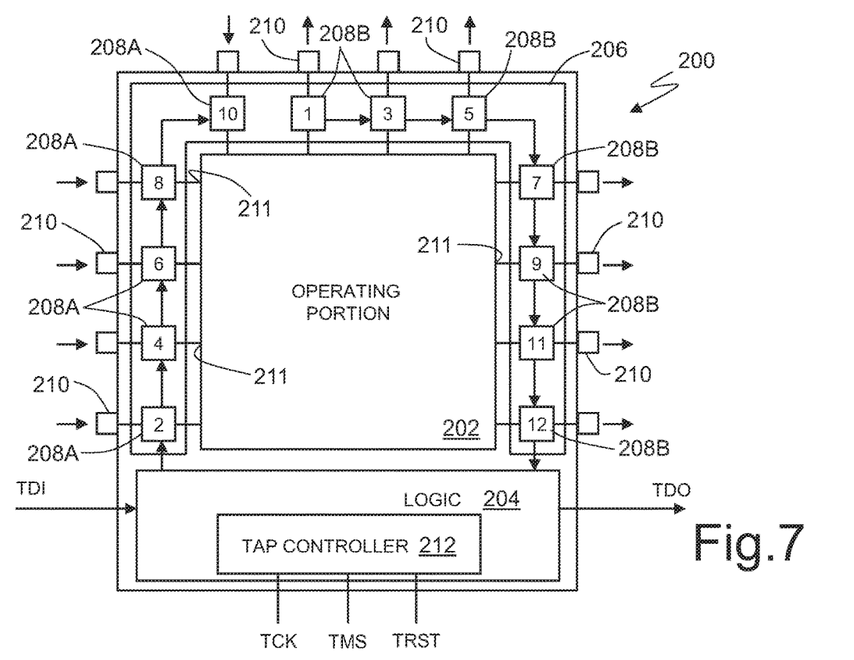
FIGS. 7 and 8 show equivalents of the connection scheme obtainable with the architecture of FIG. 6 in case of two different test modes.

Instead, by reconfiguring the test access port (TAP) 203 through the serial-input selection signal SIS, as explained in greater detail hereinafter and shown in the equivalent scheme of FIG. 7, grouping of the input test cells 208A in the input half-path through the second interconnection lines 231 (coupling of the input test cells 208A forming the converter SP) is obtained and grouping of the output test cells 208B in the output half-path through the third interconnection lines 232 (coupling of the output test cells 208B forming the converter PS) is obtained, with a considerable reduction of the time required for data shifting (short shift mode).

In fact, in this mode it is possible to carry out concurrent loading/unloading of the test cells 208, which may be performed in N (here 7) clock cycles, where 5 input bits +2 dummy bits are supplied on the test-data input pin TDI, shifted along the input half-path and loaded into the input test cells 208A (test cells numbered 2-4-6-8-10), and the 7 output bits are shifted along the output half-path and unloaded from the output test cells 208B (test cells numbered 1-3-5-7-9-11-12) towards the test logic circuitry 204. For instance, in the input half-path, first the two dummy bits may be shifted so that they may be overwritten (in the test cells numbered 8 and 10).

Figure 9:
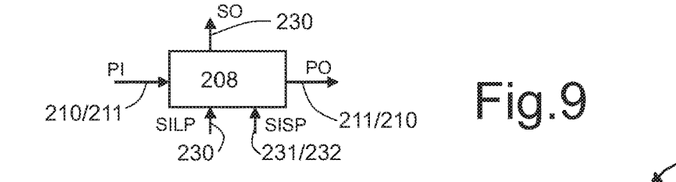
FIG. 9 is a representation of a test cell using the present architecture.
Figure 10:
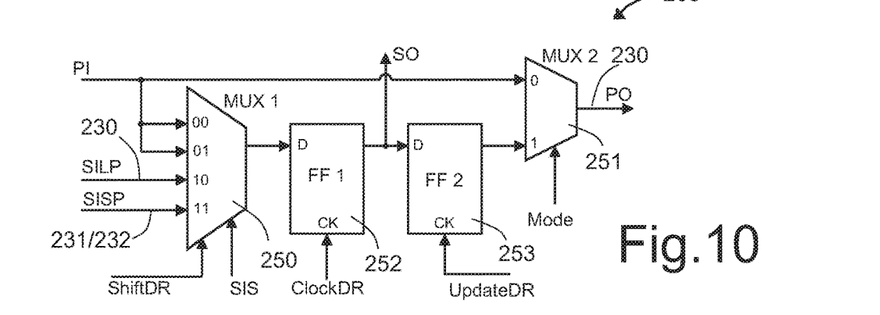
FIG. 10 shows a possible implementation of the test cell of FIG. 9.

FIGS. 9 and 10 show an embodiment of the test cells 208 that may be used in the device 1 of FIG. 6, irrespective of whether they are input test cells 208A or output test cells 208B.

As may be noted, each test cell 208 has five data inputs, designated by PI, PO, SILP (Serial-Input Long Path), SISP (Serial-Input Short Path), and SO and receiving signals having the same name. The inputs PI, PO, and SO are altogether analogous to the inputs of the test cells 108 having the same name, whereas the inputs SILP and SISP are each connected to a first connection line 231 or to a second connection line 232. Thus:

PI defines a data input connected to a data access pin 210, or to an input/output point 211 of the operating portion 202 according to whether the test cell 208 is an input test cell or an output test cell, respectively;

PO defines a data output, connected to an input/output point 211 of the operating portion 202, or to a data access pin 210, according to whether the test cell 208 is an input test cell or an output test cell, respectively;

SO defines a test output, connected to a following test cell 208 in the long path through the first connection line 230 (for all the test cells 208, except for the last test cell 208 in the long sequence, which, in the example of embodiment of FIG. 6, is numbered 12), or to the test logic circuitry 204 (for the last test cell 208 in the long sequence); in addition, SO is connected to a following input test cell 208A in the input half-path, through the second connection line 231, or a following output test cell 208B in the output half-path, through the third connection line 232, according to whether the test cell 208 is an input test cell or an output test cell, respectively;

SILP defines a long-path test input, connected to a previous test cell 208 in the long path, through the first connection line 230 (for all the test cells 208, except the first test cell 208 in the long sequence, which, in the example of embodiment of FIG. 6 is numbered 1), or to the test-data input pin TDI (for the first test cell of the long path, which, in the example of embodiment of FIG. 6, is numbered 1); and SISP defines a short-path test input, connected to a previous test cell 208 in the input half-path or in the output half-path through the second connection line 231 or the third connection line 232, according to whether the considered test cell 208 is an input test cell or an output test cell, (for all the test cells 208, except the first test cell 208 in the long sequence), or to the test-data input pin TDI (for the first input test cell of the input half-path).

As shown in FIG. 10, the structure of the test cell 208 is similar to that of the standard test cell 108, except for the fact that the first multiplexer, here designated by 250, has, as compared to the first multiplexer 150 of FIG. 3, an additional data input and an additional selection input.

In detail, the test cell 208 of FIG. 10 comprises, in addition to the first multiplexer 250, a second multiplexer 251 with two inputs and two flip-flops 252, 253. The first multiplexer 250 has four data inputs, which receive the signals SILP, SISP referred to above, as well as, duplicated, the signal PI, and is controlled by the test-mode selection signal ShiftDR (corresponding to signal with the same name in FIG. 2) and by the serial-input selection signal SIS and has an output connected to the data input of the first flip-flop 252. The first flip-flop 252 receives the first clock signal ClockDR and has an output connected to the data input of the second flip-flop 253. The second flip-flop 253 receives the second clock signal UpdateDR and has its output connected to a first input of the second multiplexer 251. The second multiplexer 251 further receives the signal PI, is controlled by the signal Mode, and has an output connected to the data output PO.

In practice, the serial-input selection signal SIS determines selective acquisition of the datum on the long-path test input SILP or on the short-path test input SISP and transfer of this acquired datum to the first flip-flop 252, enabling activation of the long path or the input/output half-paths.

Figure 11:
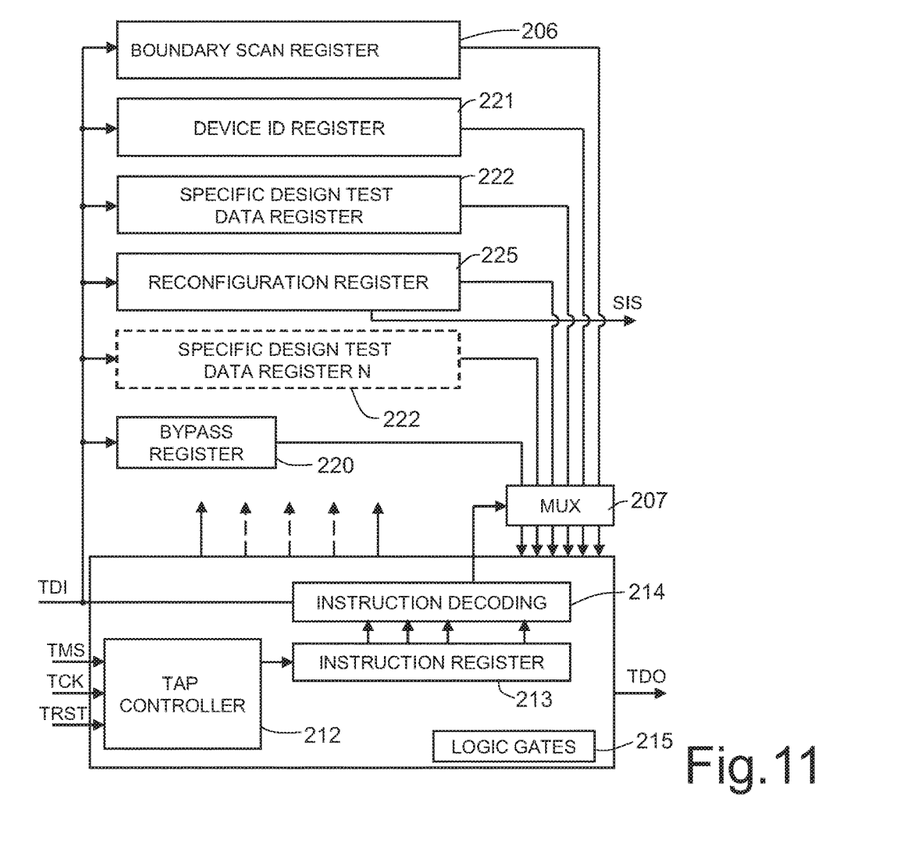
FIG. 11 shows a possible implementation of the data registers with the present architecture.

The serial-input selection signal SIS is stored in a reconfiguration register 225 provided as optional data register according to the standard 1149.1, as shown in FIG. 11. The value stored in the reconfiguration register 225 is controlled through an instruction register 213 and an instruction decoder 214, similar to the corresponding components 113 and 114 of FIG. 2. For instance, in the test logic circuitry 204 circuits may be provided implementing a dedicated logic instruction enabling loading of an appropriate datum in the reconfiguration register 225 such as to set the signal SIS (just one bit in this example) to a logic value 0 or 1, causing activation of the long path or of the input/output half-paths. This dedicated logic instruction may be first loaded into the instruction register 213 and then interpreted by the instruction decoder 214.

For the rest, the structure of the test logic circuitry 204 shown in FIG. 11 corresponds exactly to that of the test logic circuitry 104 of FIG. 2 and comprises an output multiplexer 207 and output logic gates 215. It is to be noted that also in FIG. 11 the ensemble formed by the data registers 205, the boundary scan register 206, and the output multiplexer 207 forms a set of data registers parallel connected between a common serial input (connected to the test-data input pin TDI) and a common serial output (connected to the test-data output pin TDO). Selection of one specific data register at a time, from the registers 206, 220, 221, 222 and 225, is controlled through the instruction register 213.

Figure 12:
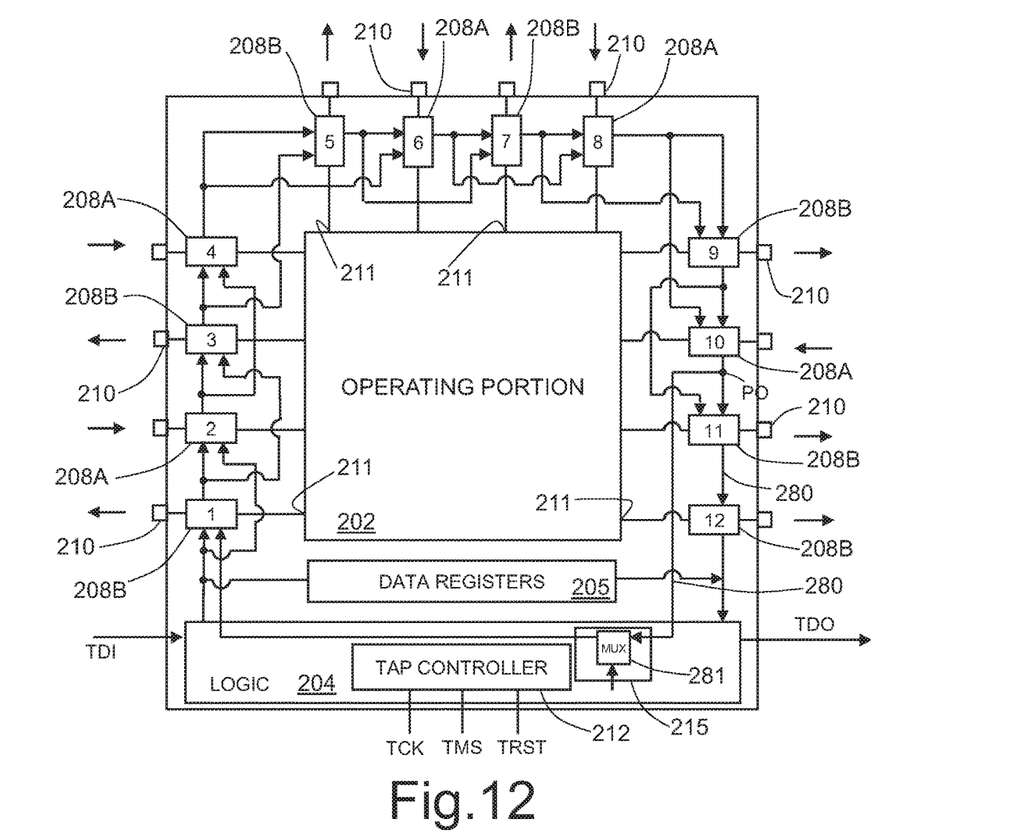
FIG. 12 shows a different embodiment of the present architecture.

FIG. 12 shows an embodiment of the integrated device 200 enabling separate testing of the input and output half-paths. To this end, the data output PO of the last input test cell 208A of the input half-path (numbered 10) is connected, through a connection line 280, to a multiplexer 281 formed together with the output logic gates 215.

Figure 13:
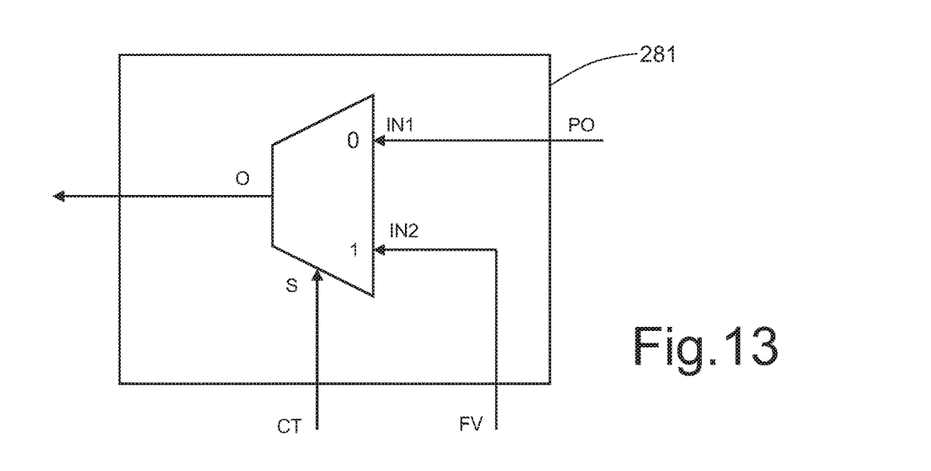
FIG. 13 is a representation of a logic component in the architecture of FIG. 12.

FIG. 13 shows an embodiment of the multiplexer 281. Here, the multiplexer 281 has two data inputs IN1, IN2, a selection input S, and an output O. The multiplexer 281 may be connected to the integrated device 200 of FIG. 12 so that the data input IN1 is connected to the data output PO of the last input test cell 208A of the input sequence (numbered 10 in FIG. 12), the second input IN2 receives a test datum FV (Filling Value), the selection input S receives a test-configuration signal CT, and the output O is connected to the first output test cell 208B of the output sequence (numbered 1 in FIG. 12).

The test-configuration signal CT may be set through the configuration register 225 of FIG. 11 (it may, for example, be one bit of the data loaded into the above register) for supplying the first output test cell 208B (numbered 1 in FIG. 12), during testing of the input half-path, with the test data loaded into the input test cells and, in during testing of the output half-path, with suitable data FV stored in at least one memory element of the configuration register 225 of FIG. 11.

Figure 14:
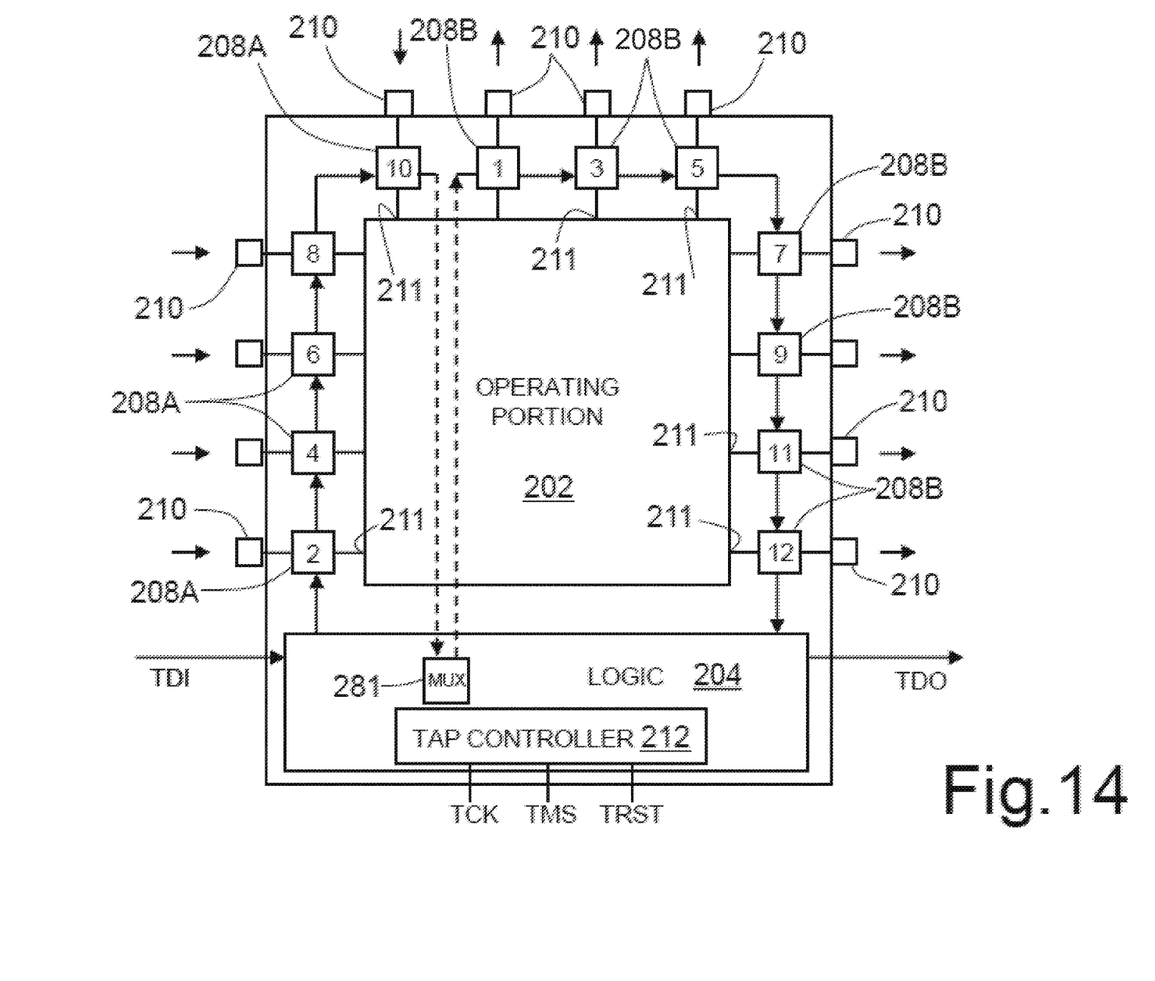
FIG. 14 shows an equivalent of the connection scheme obtainable with the architecture of FIG. 12.

Thereby, the integrated device 200, and in particular the sequence of test cells 208, may be represented with the equivalent scheme of FIG. 14, where the test cells are numbered in the same way as in FIG. 12.

By virtue of the multiplexer 281, it is possible to check the correct sequence and functionality of just the input test cells 208A or of just the output test cells 208B or of both after a reconfiguration step, passing from a full-shift test mode (long path) to the short-shift test mode (input/output half-paths).

Figure 15:
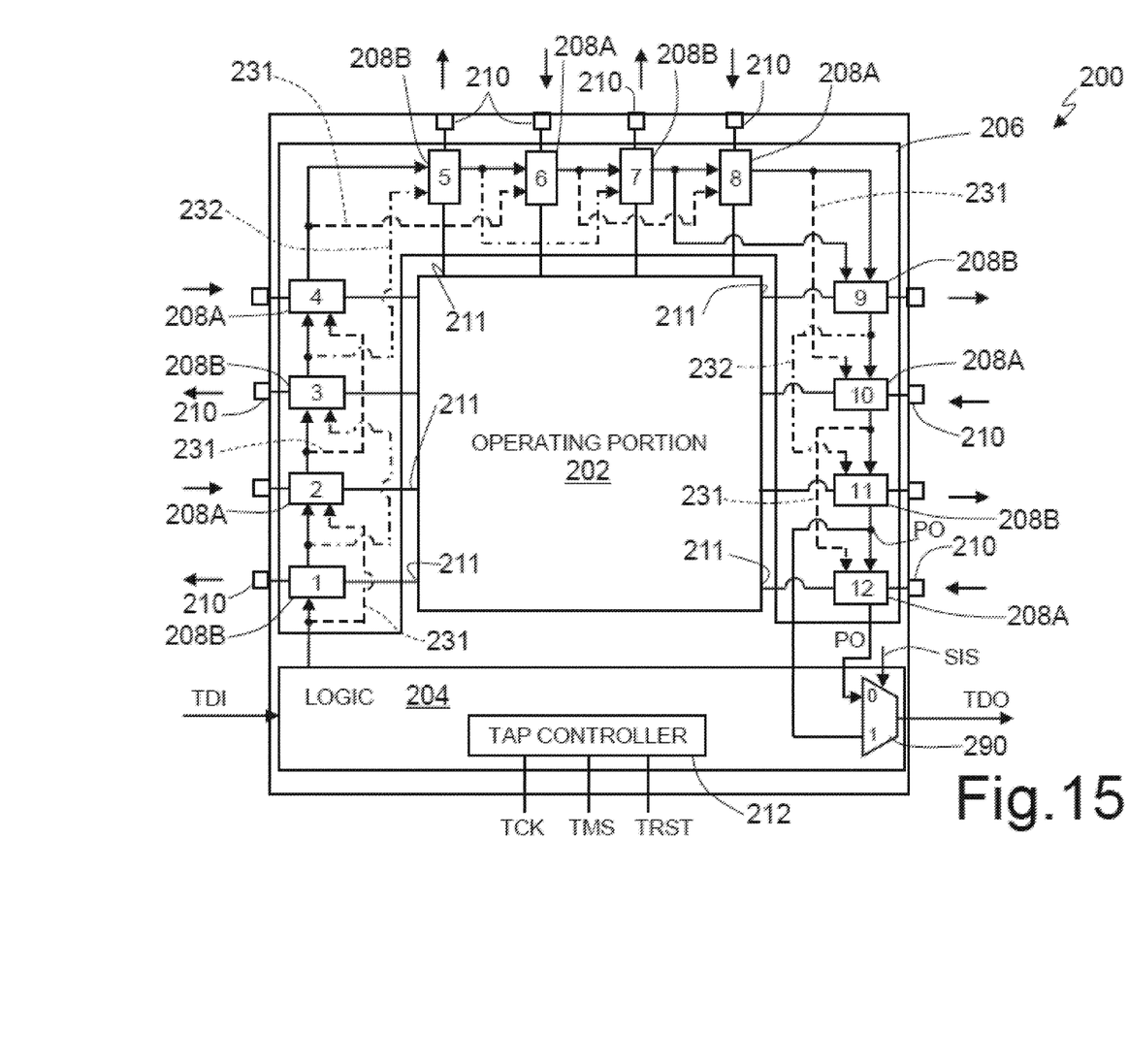
FIG. 15 shows a further embodiment of the present architecture.

FIG. 15 shows a different embodiment that may be used when the last test cell 208 of the long path is an input test cell 208A. In this case, an additional multiplexer 290 is provided, having a first data input connected to the output PO of the last test cell 208 of the long path (input test cell 208A numbered 12 in FIG. 15), a second data input connected to the output PO of the last but one test cell 208 of the long path (output test cell 208B numbered 11 in FIG. 15), a selection input receiving the serial-input selection signal SIS, and an output connected to the test-data output pin TDO (for example, through the output multiplexer 207 and the logic gates 215—FIG. 11).

The additional multiplexer 290 may be a stand-alone multiplexer or be incorporated in the output multiplexer 207 (FIG. 11).

In practice, the integrated device 200 is configured to be able to logically group all the input test cells 208A together and all the output test cells 208B together. This enables loading and unloading, via just a partial shift, of the data into/from the sequence of the test cells 208. Thereby, it is possible to reduce the number of clock cycles used for loading or unloading the test cells 208 from (M+N), where M is the number of input test cells and N is the number of output test cells, to max(M, N).

The integrated device 200 is further configured to be able to work in standard mode, by virtue of the presence of simple logic gates (including the first multiplexer 250 in the test cells 208 and the reconfiguration register 225 for reconfiguring the data registers 205), the presence of just a few additional interconnections (second and third connection lines 231, 232) that may be simply formed as metal interconnections via the usual metal levels existing in integrated circuits, and to the generation of just a few selection signals (including the serial-input selection signal SIS). Selection of one mode or the other may thus be made simply via appropriate programming.

The integrated device 200 does not affect the operating portion 202 and does not call for significant modifications in the test structure. For instance, when the chain of test cells 208 includes observe-only input cells, these may be shaped in a conventional way or be modified in a way similar to the test cells 208 by including them in the input sequence or in the output sequence, according to their position in the long sequence of the boundary scan register 206. The observe-only input cells may be, for example, grouped to the output half-path, in proximity of the test-data output pin TDO.

Furthermore, when the architecture of the integrated device 200 includes bidirectional cells (which, as known, are made up of three portions, namely, an input portion, an output portion, and a buffer portion, equal to each other and with the same structure as the test cells), it is possible to modify the structure of the input portion and of the output portion as shown in FIG. 10 and group these parts to the corresponding input half-path or output half-path, disabling the buffer portion. Alternatively, the buffer portion may be aggregated in the output half-path by possibly grouping the output portion in the input/output half-path, according to the connection of the bidirectional cell to the data access pin 210 of the integrated device 200. Within the scope of the present patent application, in the case of two-dimensional cells, these are considered as made up each of at least one input test cell and one output test cell, and, at each instant, they may function as input test cell or as output test cell.

Figure 16:
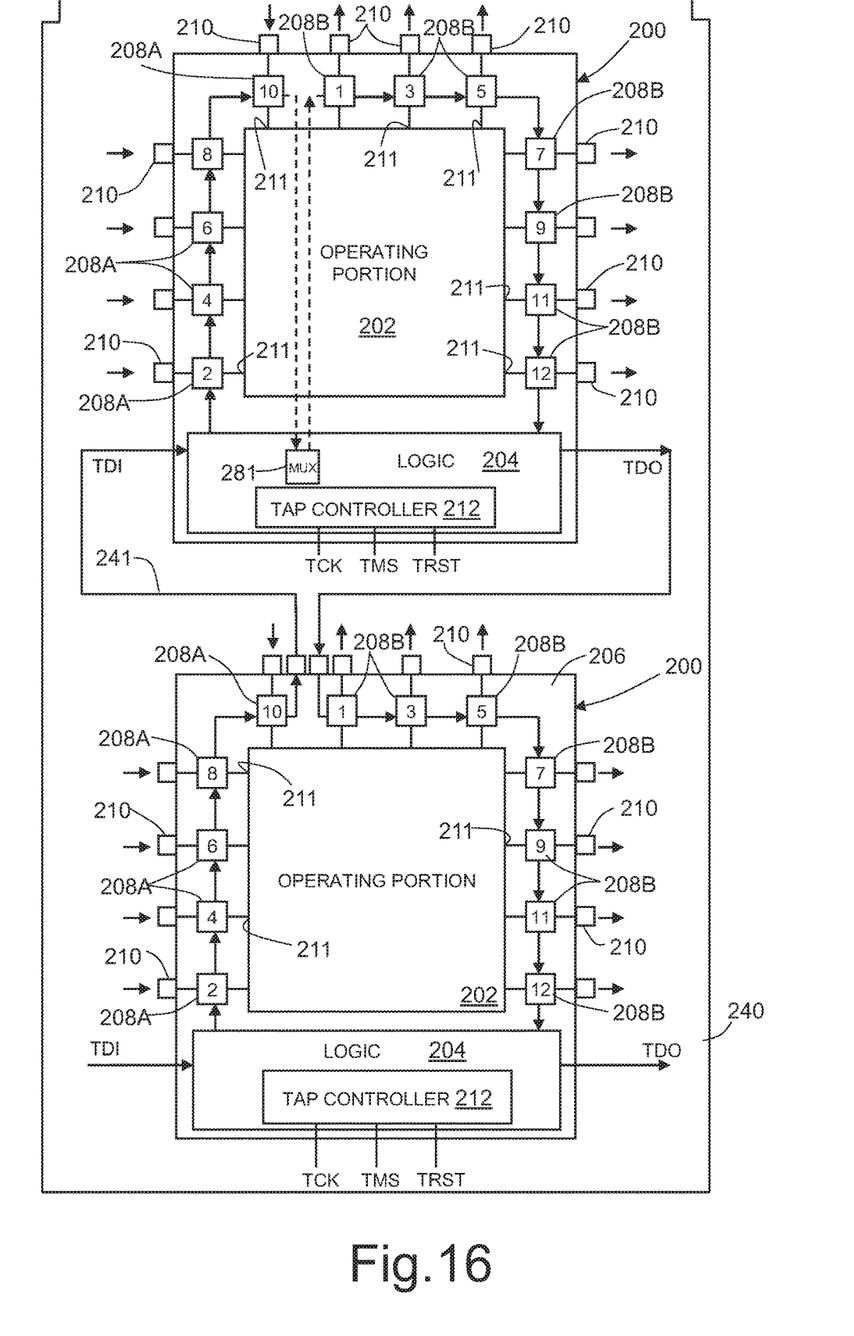
FIG. 16 shows a connection scheme of a plurality of devices according to the present invention.

Advantageously, it is possible to reduce also the test time of the interconnections between different integrated devices. For instance, FIG. 16 shows interconnection paths 241 between two integrated devices 200 mounted on a same printed-circuit board 240, by forming input/output half-paths. Here, the two input half-paths and the two output half-paths have been connected together via dedicated data access pins 210, but the data access pins 210 already present in the two integrated devices 200 may be used.

Finally, it is clear that modifications and variations may be made to the device and the test method described and illustrated herein, without departing from the scope of the present invention, as defined in the attached claims. For instance, when reconfigurability of the test portion 203 is not required, it is possible to provide only the connections according to the short test paths. Also in this case, however, it is possible to carry out a full-scan test by shifting the test bits first in the input half-path and then in the output half-path, for example, by connecting the two half-paths directly or via the multiplexer 281.

Furthermore, by forcing the first test cell in the long sequence (numbered 1 in FIG. 6) to be an input test cell 208A and the last test cell in the long sequence (numbered 12 in FIG. 6) to be an output test cell 208B, it is possible to simplify the scheme of FIG. 6 so that the test-data input pin TDI is connected only to the first test cell in the long sequence.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device integrated in a semiconductor-based body, the semiconductor-based body having a plurality of data access pins, the electronic device comprising:
   a functional portion; and
   a test portion;
   wherein the functional portion has a plurality of input/output points,
   wherein the test portion has a boundary scan register, the boundary scan register formed by a plurality of test cells arranged in the semiconductor-based body,
   wherein the plurality of test cells includes first test cells and second test cells,
   wherein the first test cells form a serial-to-parallel converter and the second test cells form a parallel-to-serial converter,
   wherein each of said first and second test cells is coupled to a respective data access pin and to a respective input/output point,
   wherein each of said first and second test cells has a first test input and a test output,
   wherein the boundary scan register defines a first test partial-path and a second test partial-path, the first test partial-path including the first test cells and the second test partial-path including the second test cells, and
   wherein the first test cells are directly coupled in series via first connection lines according to a first partial-path sequence and the second test cells are directly coupled in series via second connection lines according to a second partial-path sequence.

2. The device according to claim 1, wherein the plurality of test cells includes a first plurality of first test cells and a second plurality of second test cells, the first plurality being a different number than the second plurality.

3. The device according to claim 1, wherein the first test partial-path includes a plurality of first connection lines, each first connection line directly coupling the test output of a first test cell to the first test input of a following first test cell of the first partial-path sequence and the second test partial-path includes a plurality of second connection lines each second connection line coupling the test output of a second test cell to the first test input of a following second test cell of the second partial-path sequence.

4. The device according to claim 1, wherein the first test cells and the second test cells each have a second test input, and the test output of each test cell of the plurality of test cells is coupled to the second test input of a following test cell of the plurality of cells in a register sequence.

5. The device according to claim 4, wherein the coupling of the test output of each test cell to the second test input of the following test cell is formed by respective third connection lines directly connecting the output of each test cell of the plurality of test cells to the respective second test input of the following test cell of the plurality of cells in the register sequence.

6. The device according to claim 4, wherein each test cell of the plurality of test cells has a selection input and wherein each test cell of the plurality of test cells is configured to selectively couple its own first test input or its own second test input to its own output, and wherein the test portion includes a reconfiguration unit having a selection output connected to the selection inputs of each test cell of the plurality of test cells.

7. The device according to claim 6, wherein each test cell of the plurality of test cells includes a multiplexer element having a first data input coupled to a first connection line of the first test half-path, a second data input coupled to a second connection line of the second path, a selection input coupled to the selection input of the respective test cell, and a test output coupled to the output of the test cell.

8. The device according to claim 1, wherein the test portion includes control-logic circuitry and a reconfiguration register, the reconfiguration register configured to store a selection signal.

9. The device according to claim 8, wherein the first test partial-path has a first end and a second end, and wherein the control-logic circuitry has a selector element having a first data input, the first end of the first half-path coupled to an access-data input pin and the second end of the first test half-path coupled to the first data input of the selector element.

10. The device according to claim 9, wherein the second test partial-path has a first end and a second end, and wherein the selector element has an output, the first end of the second test half-path coupled to a test output pin and the second end of the second test half-path coupled to the output of the selector element.

11. The device according to claim 10, wherein the selector element includes a second data input and a selection input, the selector element configured to selectively output the first data input or the second data input.

12. The device according to claim 1, wherein the first and second half-path sequences are mutually distinct and form together a register sequence.

13. A method to test an electronic device integrated in a semiconductor-based body, the semiconductor-based body having a plurality of data access pins, the electronic device having a functional portion and a test portion, wherein the test portion has a boundary scan register, the boundary scan register formed by a plurality of test cells arranged in the semiconductor-based body, wherein the plurality of test cells includes a first plurality of first test cells and a second plurality of second test cells, and wherein each of said first and second test cells is coupled to a respective data access pin and to a respective input/output point of the functional portion, the method comprising:
via a plurality of first connection lines, directly connecting the first test cells in a first test partial-path defining a first partial-path sequence; and
via a plurality of second connection lines, directly connecting the second test cells in a second test partial-path defining a second partial-path sequence.

14. The method according to claim 13, wherein the first plurality of first test cells includes a different number of test cells than the second plurality of second test cells.

15. The method according to claim 13, wherein the test portion includes M first test cells and N second test cells, the method comprising:
serially receiving input test data on a test-data input pin;
serially shifting the input test data into said first test cells according to the first partial-path sequence;
parallel transferring the input test data from the first test cells to the input/output points of the functional portion;
parallel transferring processed test data from the input/output points of the functional portion to the second test cells; and
serially shifting the processed test data in said second test cells to a test-data output pin according to the second partial-path sequence.

16. The method according to claim 15, wherein serially shifting the input test data in said first cells and serially shifting the processed test data in said second test cells are carried out concurrently in a number of clock cycles, the number equal to max(M, N).

17. The method according to claim 15, wherein parallel transferring the input test data and parallel transferring processed test data are carried out in a same clock cycle.

18. The method according to claim 13, further comprising:
selecting between a full test procedure and a short test procedure, wherein the full test procedure connects the first and second test cells together according to a register sequence, and wherein the short test procedure connects the first test cells together according to the first partial-path sequence and connects the second test cells together according to the second partial-path sequence.

19. An integrated circuit, comprising:
functional circuitry; and
test circuitry, the test circuitry configured to perform a first test sequence different from an IEEE 1149.1 standard, the test circuitry further configured to perform a second test sequence according to the IEEE 1149.1 protocol, the test circuitry including:
a first number of first test cells serially linked and arranged as a serial-to-parallel converter during the first test sequence; and
a second number of second test cells serially linked and arranged as a parallel-to-serial converter during the first test sequence, wherein the first test cells and the second test cells are serially linked together during the second test sequence.

20. The integrated circuit according to claim 19, wherein the first number and the second number are different numbers.

21. The integrated circuit of 19, wherein the first test cells and the second test cells are serially linked to form a boundary scan register during performance of the second test sequence.

22. The integrated circuit of 21, wherein, during performance of the first test sequence, the first test cells are input test cells and the second test cells are output test cells.

23. The integrated circuit of 19, wherein the first test cells are input test cells configured to transfer input data from a respective data access pin to the functional circuitry, and the second test cells are output test cells configured to transfer second data from the functional circuitry to a respective data access pin.

* * * * *